United States Patent [19]

Murakami et al.

[11] Patent Number: 4,604,160

[45] Date of Patent: Aug. 5, 1986

[54] METHOD FOR MANUFACTURE OF PRINTED WIRING BOARD

[75] Inventors: Kanji Murakami, Mito; Haruo Akahoshi; Mineo Kawamoto, both of Hitachi; Motoyo Wajima; Yoichi Matsuda, both of Hitachi; Kyoji Kawakubo, Naka; Minoru Kanechiku, Katsuta; Toyofusa Yoshimura, Naka; Makoto Matsunaga, Katsuta, all of Japan

[73] Assignee: Hitachi, Ltd., Tokyo, Japan

[21] Appl. No.: 689,802

[22] Filed: Jan. 8, 1985

[30] Foreign Application Priority Data

Jan. 11, 1984 [JP] Japan .................... 59-3152

[51] Int. Cl.⁴ .................... C23F 1/02; B44C 1/22; B05D 5/12; C25D 5/02
[52] U.S. Cl. .................... 156/630; 29/846; 156/631; 156/634; 156/645; 156/656; 156/902; 156/150; 156/233; 174/68.5; 427/96; 430/314; 430/315; 430/318
[58] Field of Search .............. 156/629, 630, 631, 634, 156/645, 656, 902, 150, 151, 233, 235; 174/68.5; 427/96; 204/15, 23, 32.1; 29/846; 430/313, 314, 315, 318

[56] References Cited

U.S. PATENT DOCUMENTS

| | | | |
|---|---|---|---|
| 3,181,986 | 5/1965 | Pritikin | 156/233 |
| 4,306,925 | 12/1981 | Lebow et al. | 156/150 |
| 4,354,895 | 10/1982 | Ellis | 156/631 |
| 4,465,538 | 8/1984 | Schmoock | 156/233 |

*Primary Examiner*—William A. Powell
*Attorney, Agent, or Firm*—Antonelli, Terry & Wands

[57] ABSTRACT

This invention concerns a method for the manufacture of a printed wiring board which particularly proves useful as a printed coil. This method is characterized by the fact that in the work in process which has undergone the step for formation of a conductor circuit and which has not undergone the step for separation of a plating resist, the plating resist and other insulating substratal material are separated for transfer from the surface of the substrate having the conductor circuit formed thereon.

Since this method permits formation of an extremely thin insulating layer and a conductor circuit layer thicker than the insulating layer, it enables production of very thin printed wiring board and printed coil having high circuit density in the surfaces of component layers as well as in the direction of superposition of component layers.

18 Claims, 9 Drawing Figures (A)

(B)

(C)

(a)

(b)

(c)

(d)

(e)

(f)

(g)

(a)

(b)

(c)

(d)

(e)

(f)

(g)

(a)

(b)

(c)

(d)

(e)

(f)

(g)

(a)

(b)

(c)

(d)

(e)

(f)

(g)

(a)

(b)

(c)

(d)

(e)

(f)

(g)

(h)

(a)

(b)

(c)

(d)

(e)

(f)

(g)

(h)

(a)

(b)

(c)

(d)

(e)

(f)

(g)

(h)

(a)

(b)

(c)

(d)

(e)

(f)

(g)

(h)

METHOD FOR MANUFACTURE OF PRINTED WIRING BOARD

BACKGROUND OF THE INVENTION

1. Field of the Invention

This invention relates to a method for the manufacture of a flexible printed wiring board by plating, particularly to a method for the manufacture of printed coils.

2. Description of the Prior Art

In the pattern plating method, it is difficult to maintain an adequate balance between the tight adhesion of a plating resist and a conductor circuit to a metallic board during the course of plating and the peeling property thereof from the metallic board during the course of transfer. The plating conductor circuit and the plating resist are required to remain intimately or firmly adhering to the metallic board during the course of the printing. When this adhesion is excessively tight, the separation from the metallic board during the course of transfer is obtained with difficulty. There even ensues a possibility that part of the conductor circuit and the plating resist will remain on the metallic board, rendering desired transfer difficult to obtain. When the separation during the transfer is enabled to occur easily, the plating resist readily peels, making production of satisfactory pattern difficult to obtain.

Enhancement of adhesion is obtained by coarsening the surface of the metallic board and facilitation of separation by applying on the surface of the metallic board a release agent such as, for example, silicone oil, wax, colloidal graphite, stearic acid of a salt thereof. By these measures, however, the range in which a printed wiring board of high quality is obtained is limited. These measures admit of a variety of causes for dispersion of product quality and permit production of a satisfactory printed wiring board with great difficulty.

As means of producing a printed wiring board by the electric pattern plating technique, Japanese Patent Application Laid-open No. SHO 58(1983)-9397 discloses a method which comprises laminating a dry film of photosensitive resin on a metallic board, exposing the dry film through a mask of a given wiring pattern, developing and post-baking the exposed dry film thereby forming a resist, electroforming copper on the exposed portion of the surface of the metallic board in a thickness not exceeding the thickness of the dry film, separating the resultant electroformed pattern of copper from the metallic board, and applying it fast on an insulating substate. In the disclosure of this method, however, nothing is mentioned about any means of fully satisfying the two requirements, tight adhesion during the course of electroforming and easy separation after the electroforming.

SUMMARY OF THE INVENTION

This invention aims to solve the problem posed by the pattern plating method described above and provide methods for the production of a thin printed wiring board and the production of a thin printed coil, both incorporating therein an extremely thin insulating layer and a conductor circuit layer thicker than the insulating layer, by enabling the conductor circuit and the plating resist to adhere to the metallic board with enhanced tightness during the course of plating and enabling them to peel easily and thoroughly from the metallic board in the subsequent step.

The first aspect of this invention is characterized by comprising the following steps (1) through (6) in the order mentioned.

(1) The step of applying a metallic film on a substrate, (2) the step of forming a plating resist on the metallic film except the portion intended for the formation of a conductor circuit, (3) the step of plating the metallic film surface covered with the plating resist thereby forming a conductor circuit, (4) the step of separating the metallic film, the conductor circuit, and the plating resist jointly from the substrate, (5) the step of transferring them to an insulating substrate, and (6) the step of removing the metallic film so transferred by etching.

Optionally, this first aspect of the present invention may further comprise the step of coarsening the surface of the metallic film between the steps (1) and (2) mentioned above. The insulating substratal material may have adhesive agent applied in advance on the surface thereof to which the aforementioned transfer is effected. Further in the transfer step of (5) mentioned above, an insulating substratal material may be applied by printing after the separation.

The second aspect of this invention is characterized by comprising the following steps (1) through (5) in the order mentioned.

(1) The step of applying a metallic film on a substrate, (2) the step of forming a plating resist on the metallic film except the portion intended for the formation of a conductor circuit, (3) the step of plating the metallic film surface covered with the plating resist thereby forming a conductor circuit, (4) the step of applying an insulating substratal material fast, i.e., firmly adhering, to the surface of the plating resist and that of the conductor circuit, separating the metallic film, the conductor circuit, and the plating resist in conjunction with the insulating substratal material from the substrate, and immediately effecting their transfer, and (5) the step of removing the metallic film so transferred by etching.

This second aspect of the present invention, similarly to the first aspect thereof, may further comprise a step of coarsening the surface of the metallic film between the steps (1) and (2) mentioned above. The insulating substratal material may have adhesive agent applied in advance on the surface thereof to which the aforementioned transfer is effected. The insulative substrate may be formed by printing on the surface of the plating resist.

The printed wiring board according to either of the first and second aspects of the present invention can be diverted to a printed coil by causing the wiring pattern to be formed in a spiral shape.

The third aspect of this invention concerns production of a printed coil, characterized by comprising the following steps (1) through (7) in the order mentioned.

(1) The step of applying a metallic film on a substrate, (2) the step of forming a plating resist on the metallic film except the portion intended for the formation of a conductor circuit, (3) the step of plating the metallic film surface covered with the plating resist thereby forming a conductor circuit, (4) the step of separating the metallic film, the conductor circuit, and the plating resist jointly from the substrate, (5) the step of transferring these separated components to an insulating substrate, (6) the step of removing by etching the metallic film so transferred, thereby producing in consequence of the foregoing steps a printed wiring board having a conductor circuit formed therein in a spiral shape, and (7) the step of alternately superposing circuit resist layers containing the spiral circuit and insulating substrate layers and, at the same time, establishing electric continuity between the adjacent spiral circuits.

This third aspect of the present invention may further comprise a step of coarsening the surface of the metallic film between the steps (1) and (2) mentioned above. The insulating substratal material may have adhesive agent applied in advance on the surface thereof to which the aforementioned transfer is effected. Further, in the step (5) mentioned above, an insulating substratal material may be applied by printing subsequent to the separation.

The fourth aspect of this invention also concerns a printed coil and is characterized by comprising the following steps (1) through (6) in the order mentioned.

(1) The step of applying a metallic film on a substrate, (2) the step of forming a plating resist on the metallic film except the portion intended for the formation of a conductor circuit, (3) the step of plating the metallic film surface covered with the plating resist thereby forming a conductor circuit, (4) the step of applying an insulating substratal material to adhere firmly to the surface of the plating resist and that of the conductor circuit, separating the metallic film, the conductor circuit, and the plating resist in conjunction with the insulating material from the substrate, and immediately effecting their transfer, (5) the step of removing by etching the metallic film so transferred, thereby producing in consequence of the foregoing steps a printed wiring board having a conductor circuit formed therein in a spiral shape, and (6) the step of alternately superposing circuit resist layers containing the spiral circuit and insulating substrate layers and, at the same time, establishing electric continuity between the adjacent spiral circuits.

This fourth aspect of the present invention, similarly to the third aspect of the invention, may further comprise a step of coarsening the surface of the metallic film between the steps (1) and (2) mentioned above. The insulating substratal material may have adhesive agent applied in advance on the surface thereof to which the aforementioned transfer is effected. Further, the insulating substratal material may be formed by printing on the surface of the plating resist.

This invention is applicable not only to one-face printed wiring board but also to a two-face printed wiring board having conductor circuits applied fast, i.e., firmly, through the medium of an adhesive agent layer to both sides of an insulating film. The printed wiring board obtained by this invention can be diverted as a printed coil for use in a flat motor. The printed coil in its regular form is produced by superposing printed wiring boards (printed film units) having conductor circuit patterns applied through the medium of an insulating substratal material on the opposite sides thereof.

As is evident from the foregoing description, the invention in the production of a printed wiring board by the pattern plating technique enables the plating resist and the plated film of conductor circuit to remain adhering firmly to the metallic film during the course of plating and, in the subsequent step of transfer, enables them to be separated smoothly from the metallic substrate by effective use of the metallic film to ensure easy and through transfer. Thus, the methods of this invention are capable of producing a printed wiring board incorporating an extremely thin insulating layer and a conductor circuit layer thicker than the insulating layer. This invention, therefore, realizes production of extremely thin, highly accurate and delicate printed wiring boards and printed coils which have high circuit density in the direction of supervision of layers as well as in the direction of surfaces of superposed layers.

DETAILED DESCRIPTION OF PREFERRED EMBODIMENTS

Figure 2:
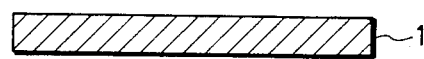
FIGS. 2a–g,
FIGS. 3a–g,
FIGS. 4a–g, and
FIGS. 5a–g are process diagrams illustrating steps of the production of a printed wiring board involved in a working example of the present invention.
Figure 2:
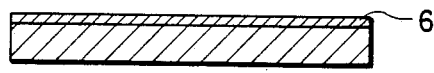
Figure 2:
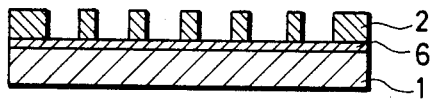
Figure 2:
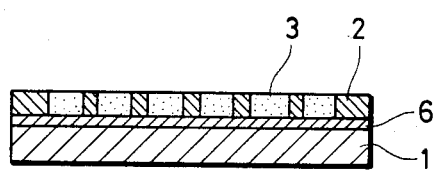
Figure 2:
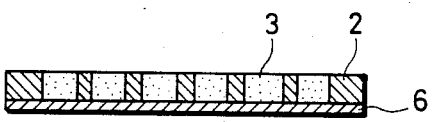
Figure 2:
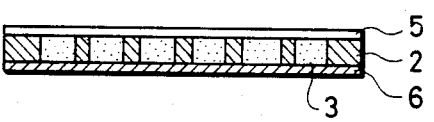
Figure 2:
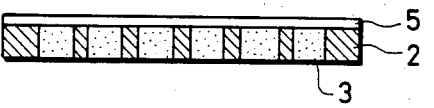
Figure 3:
Figure 3:
Figure 3:
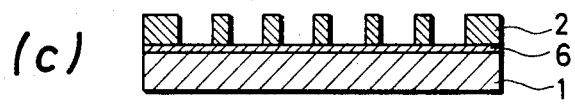
Figure 3:
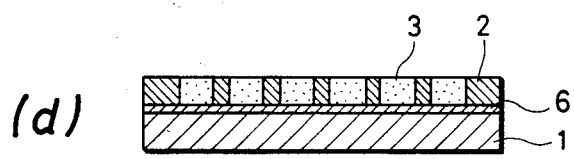
Figure 3:
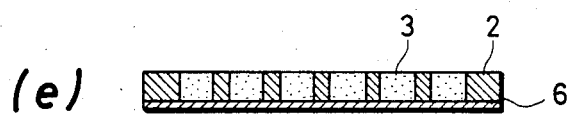
Figure 3:
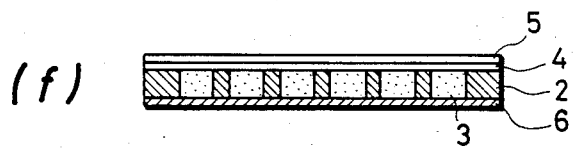
Figure 3:
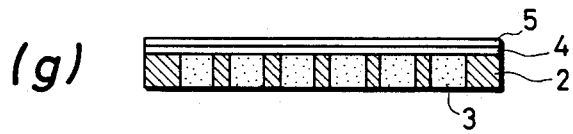
Figure 4:
Figure 4:
Figure 4:
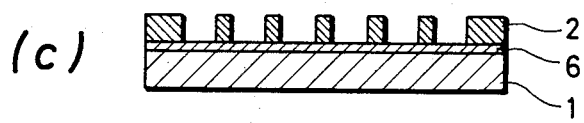
Figure 4:
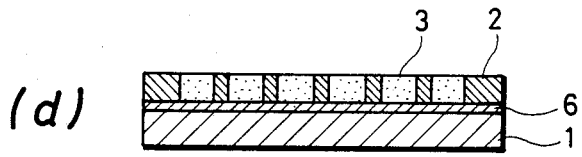
Figure 4:
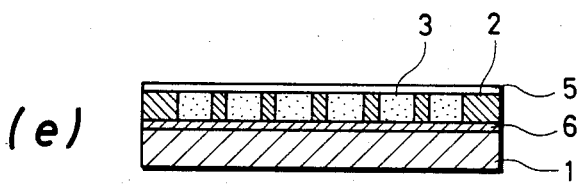
Figure 4:
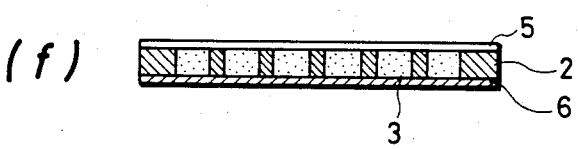
Figure 4:
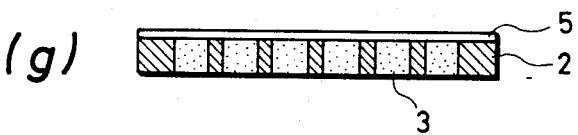
Figure 5:
Figure 5:
Figure 5:
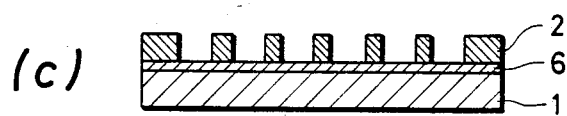
Figure 5:
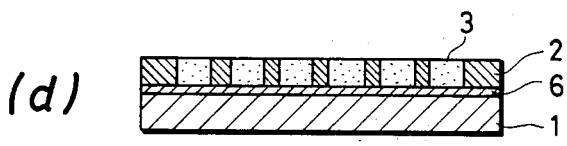
Figure 5:
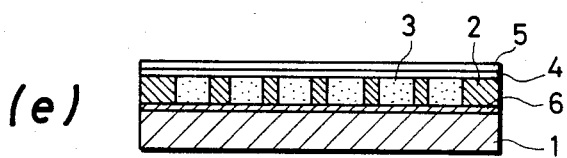
Figure 5:
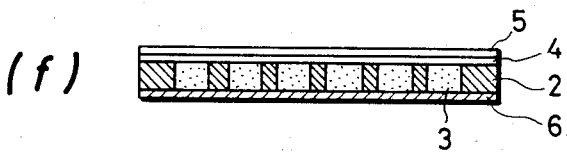
Figure 5:
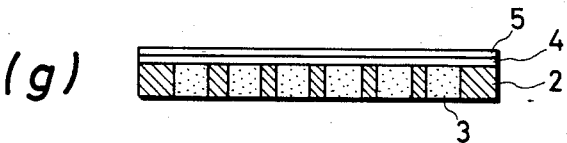

Now, one working example of the present invention will be described below with reference to FIG. 2. A metallic film 6 is formed on a metallic board 1 (FIG. 2a) and the surface of the metallic film 6 is coarsened (FIG. 2b). Then, the coarsened metaliic film is masked with a plating resist 2 (FIG. 2c). Subsequently, a conductor circuit 3 is formed thereon by plating (FIG. 2d). The conductor circuit 3 and the plating resist 2 are separated in conjunction with the metallic film 6 from the metallic board (FIG. 2e) and an insulating film 5 is applied on them (FIG. 2f). Further, the metallic film 6 is removed by etching from the conductor circuit 3 and the plating resist 2 (FIG. 2g) to complete a printed wiring board.

Figure 6:
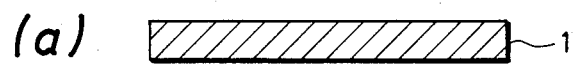
FIGS 6a–h,
FIGS. 7a–h,
FIGS. 8a–h, and
FIGS. 9a–h are process diagrams illustrating steps of the production of a printed coil involved in another working example of the present invention.
Figure 6:
Figure 6:
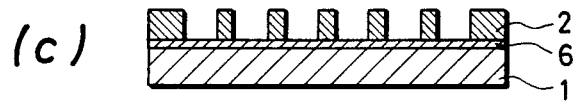
Figure 6:
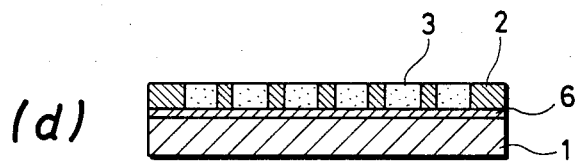
Figure 6:
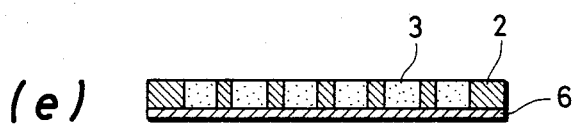
Figure 6:
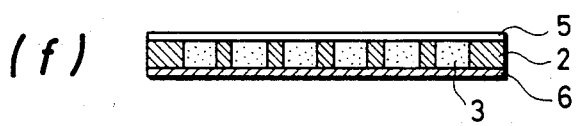
Figure 6:
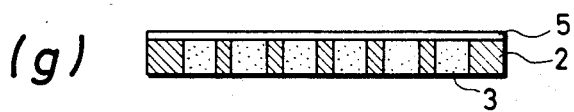
Figure 6:
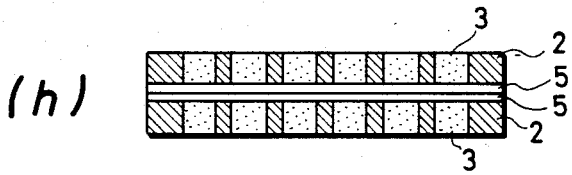
Figure 7:
Figure 7:
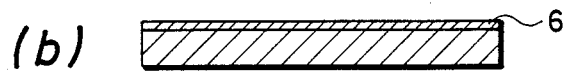
Figure 7:
Figure 7:
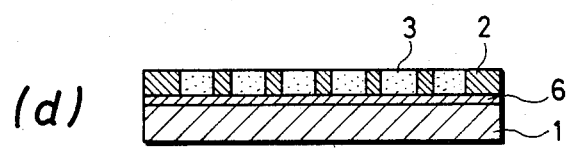
Figure 7:
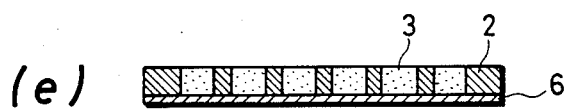
Figure 7:
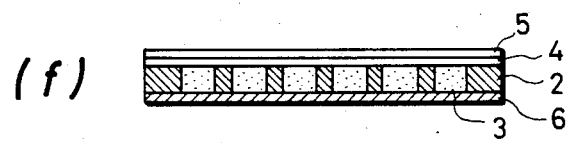
Figure 7:
Figure 7:
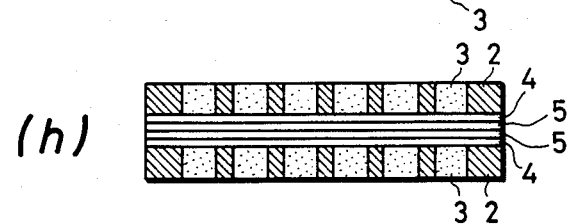
Figure 8:
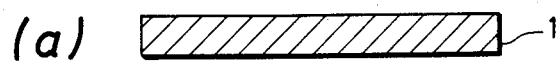
Figure 8:
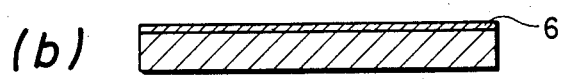
Figure 8:
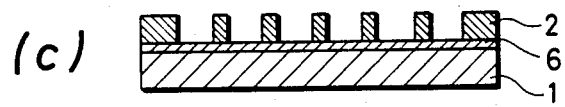
Figure 8:
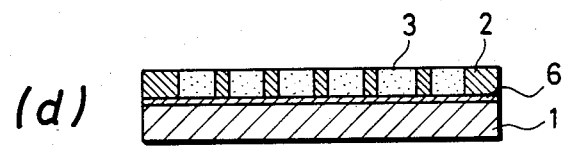
Figure 8:
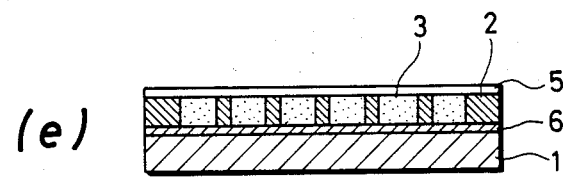
Figure 8:
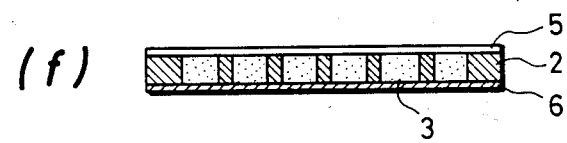
Figure 8:
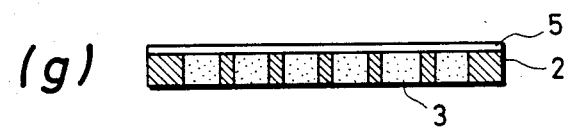
Figure 8:
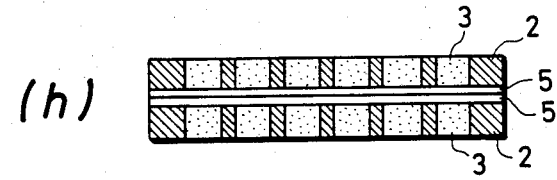
Figure 9:
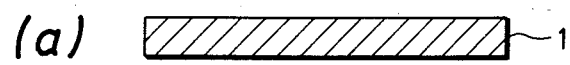
Figure 9:
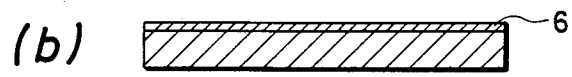
Figure 9:
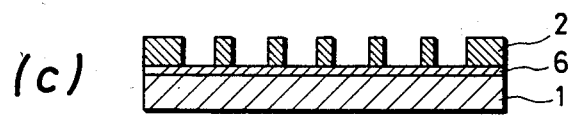
Figure 9:
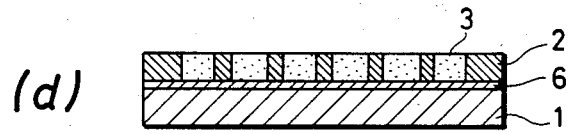
Figure 9:
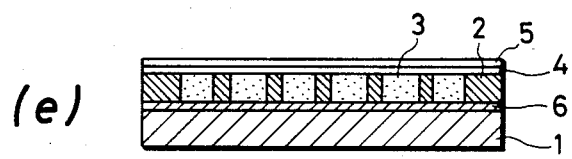
Figure 9:
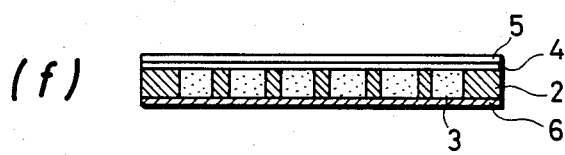
Figure 9:
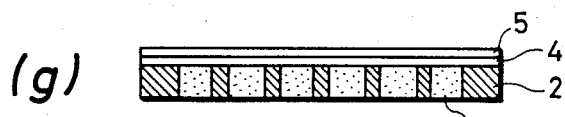
Figure 9:
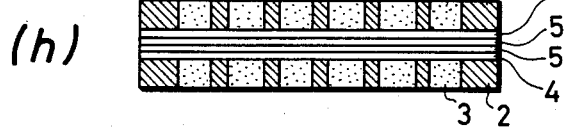

FIG. 6 depicts the production of a printed coil unit (FIG. 6h), subsequently to the step of FIG. 2g, by superposing printed wiring boards incorporating a conductor circuit pattern one each on the opposite sides of an insulating substratal material.

In the present working example, eight spiral wirings are formed on the surface as shown in (A) and (C). The product, though not shown, is a laminate of a total of six units each consisting of one upper and one lower wiring board. The 13th layer constitutes itself a F.G. (frequency generator) coil layer as shown in (B).

Figure 1:
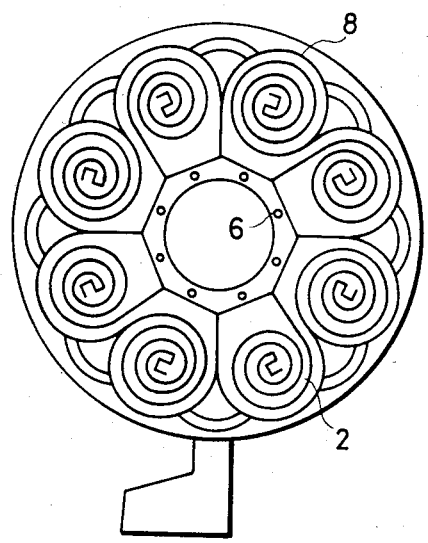
FIGS. 1a–c is an explanatory diagram of a printed coil as one embodiment of this invention, (A) representing a front view, (B) a rear view, and (C) a perspective view respectively.
Figure 1:
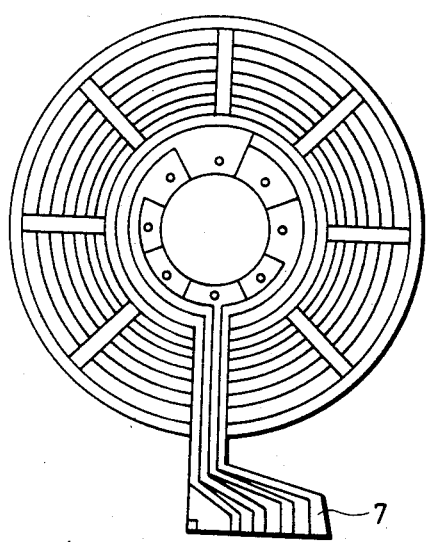
Figure 1:
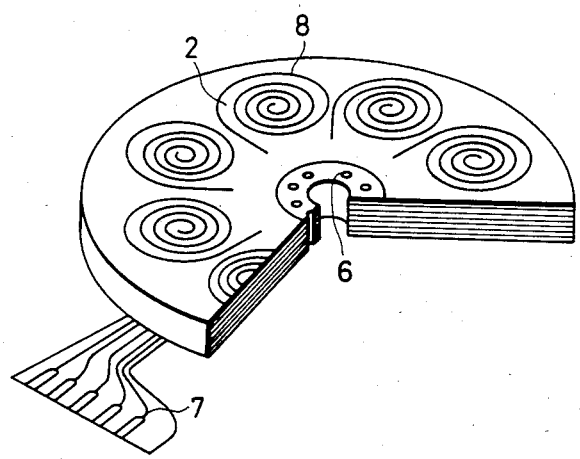

The printed coil insulated by the plating resist 8 is a unit formed by vartically superposing two layers each containing two adjacent spiral coils. The vertically paired coils are electrically connected to each other by spot welds or through holes. The electric current which passes a connecting terminal 7 of FIG. 1 is distributed by an interlayer connecting terminal 6 to the coiled conductor circuits 2. The connecting terminals may be formed by distributing through holes or spot welds within the insulating substratal material along the interface between the conductor circuit and the insulating substratal material.

In this invention, the metallic board 1 may be formed of stainless steel, titanium, or aluminum. To ensure uniform formation of the metallic film 6 of the metallic board 1, the surface of the metallic board 1 is desired to be cleaned in advance.

The metallic film 6 may be formed by vacuum deposition, chemical plating, or electric plating. In this case, the metallic film 6 and the metallic board 1 are desired to adhere tightly or firmly to each other so that they will not entrap air or separate from each other and yet will peel off each other easily in the subsequent step. Because of this requirement, the metallic board 1 and the metallic film 6 are desired to be made of dissimilar metals. In one possible combination, the metallic film 6 is made of copper and the metallic board 1 of stainless steel.

When the metallic board 1 is made of stainless steel, titanium, aluminum, or chromium, it forms a thin oxide film (a good conductor of electricity) on the surface and, therefore, fails to offer very high affinity or adhesiveness to the metallic film 6. Consequently, the moderate separation which they are desired to offer during the subsequent course of transfer can be secured here.

The thickness of the metallic film 6 is not particularly required to be limited, it is desired to fall in the range of 1 to 10 $\mu$m in due consideration of the convenience of the subsequent works of coarsening and etching. The material for the metallic film 6 may be selected from a wide variety including copper, nickel, silver, zinc, aluminum, and various alloys. Among other metals available, copper is adopted as the most popular metal. The metallic film 6 is formed of copper most easily by electric plating. Since the metallic film is destined to be removed in one subsequent step by etching, it is desired to be made of the same material as the conductor 3 or some other material more suscptible to removal by etching.

When the surface of the formed metallic film 6 is not sufficiently coarsened, there may ensue a possibility that the plating resist will peel off while the plating for the formation of the conductor circuit 3 is in process. The coarsening of the surface may be mechanically carried out. It is nevertheless performed more easily chemically. For example, treatment of the surface with ammonium persulfate, cupric chloride, or ferric chloride provides desired coarsening in a matter of several minutes.

The plating resist 2 to be formed on the metallic film 6 is required to ensure formation of an extremely fine conductor circuit. To meet this requirement, it is desired to be a dry film of photosensitive resin having a uniform thickness. This film is deposited tightly or firmly on the coarsened surface of the metallic film 6, then exposed through a negative mask to the ultraviolet light, and subjected to development with an organic solvent. Consequently, it forms a very fine plating resist pattern.

When the conductor circuit 3 is formed by electric plating, use of copper as the plating material proves advantageous from the standpoint of electroconductivity. An ordinary copper plating bath can be used for that purpose. Specifically, a copper sulfate plating bath which permits easy control can be adopted.

As the insulating film 5 possessing adhesive agent 4, a film of polyester or polyimide coated with an epoxy type or polyester type adhesive agent can be used. The insulating film 5 possessing the adhesive agent 4 is applied on the surface of the conductor circuit 3 and that of the plating resist 2 and then separation is effected between the metallic board 1 and the metallic film 6 to permit transfer of the conductor circuit onto the insulating film 5 side. In this case, owing to the presence of the metallic film 6, this transfer can be carried out easily and safely.

Thereafter, the conductor circuit integrated with the printed wiring board can be obtained by removing by etching the metallic film 6 which has been separated in conjunction with the plating resist 2 and the conductor circuit 3 and is now adhering thereto.

Optionally, the metallic board 1 may be substituted by a substrate which is formed by depositing a metallic layer on the surface of a non-metallic substrate. When the metallic film 6 is formed by chemical plating instead of electric plating, a substrate possessing no metallic surface may be used in the place of the metallic board 1. The formation of the conductor circuit 3 on the metallic film 6 can be effected by chemical plating in the place of the electric plating described above.

EXAMPLE 1

A stainless steel board 200 mm×300 mm in area had its surface abraded with cleanser and then washed with neutral detergent. The stainless board was washed with water and immersed in a copper plating bath of the following composition until the plate consequently formed thereon grew to a thickness of 5 $\mu$m.

| Copper sulfate | 75 g/liter |
|---|---|
| Sulfuric acid | 190 g/liter |
| Cupric chloride | 100 mg/liter |
| Glossing agent (Sulcup AC-90) | 5 ml/liter |

The plating was carried out at a current density of 3 A/dm$^2$ and a temperature of 25° C. The aforementioned "Sulcup AC-90" is a trademark designation for the glossing agent manufactured and marketed by Uemura Industries, Ltd.

Then, the board was washed with water and the plated surface of the board was coarsened with a coarsening agent of the following composition.

| Cupric chloride | 40 g/liter |
|---|---|
| Hydrochloric acid | 500 g/liter |

The coarsening treatment was carried out at 40° C. for 2 minutes, with the agent kept stirred with blown air.

The board was then washed thoroughly with water and dried. A negative type dry film 50 $\mu$m in thickness (produced by Thiokol Dynachem Corporation of the U.S.A. and marketed under trademark designation of Laminar GT) was deposited tightly on the dry board. Further, a negative mask for defining the pattern of a conductor circuit was deposited intimately thereon. The film was exposed through this negative mask to the ultraviolet light. Then, the film was subjected to development in trichloroethane to give rise to a plating resist pattern. By subjecting the board to electric plating in the aforementioned copper sulfate plating bath under the electric plating conditions mentioned above to produce a conductor circuit 3 of a thickness of 50 $\mu$m.

Subsequently, an adhesive agent-applied polyester film (polyester film thickness 25 $\mu$m, produced by Nikkan Industries Co., Ltd.) was superposed on the plating resist and the conductor circuit 3 and laminated at 140° C. by the use of a roll laminator.

The resultant composite was cooled. Slits were formed in the peripheral part of the composite with a cutter knife and one corner formed of such slits was nipped and pulled up to separate the metallic (copper) film 6, the conductor circuit 3, and the plating resist 2 jointly from the stainless steel board 1. After this separation, the metallic (copper) film layer 6 covering the entire surface was removed by etching with an aqueous 200 g/liter ammonium persulfate solution to complete a printed wiring board.

A total of 20 printed wiring boards were trially produced by following the procedure described above. All the samples proved satisfactory.

EXAMPLE 2

A stainless steel board 200 mm × 300 mm in area had its surface abraded with cleanser and then washed with neutral detergent. This stainless steel board was washed with water and immersed in a copper plating bath of the following composition until the plate consequently formed thereon grew to a thickness of 8 μm.

| Copper sulfate | 75 g/liter |
| --- | --- |
| Sulfuric acid | 190 g/liter |
| Cupric chloride | 100 mg/liter |
| Glossing agent (Sulcup AC-90) | 5 ml/liter |

The plating was carried out at a current density of 3 A/dm$^2$ at a temperature of 25° C. Then, the plated stainless steel board was washed with water and had the copper plated surface thereof coarsened with a coarsening agent of the following composition.

| Ammonium persulfate | 200 g/liter |
| --- | --- |
| Sulfuric acid | 5 g/liter |

This surface coarsening was carried out at room temperature for 2 minutes, with the bath kept swirled. Then, the plated board was thoroughly washed with water and dried. A dry film 80 μm in thickness (produced by Hitachi Chemical Co., Ltd. and marketed under trademark designation of Fotek SR-3000) was deposited by lamination thereon. A mask for defining a conductor circuit pattern was deposited fast thereon. The film was exposed through the mask to the ultraviolet light. Then, it was developed in trichloroethane to produce a plating resist pattern. Subsequently, the resultant composite was subjected to electric plating with copper in the aforementioned copper plating bath under the aforementioned plating conditions, to form a conductor circuit 80 μm in thkckness. Slits were formed in the peripheral part of the composite with a cutter knife and one corner formed of the slits was nipped and pulled up to separate the conductor circuit and the underlying copper plate layer from the stainless steel board. Subsequently, an adhesive agent-applied polyester film (polyester film 25 μm in thickness, produced by Nikkan Industries Co., Ltd.) was superposed on the side on which the plating resist and the conductor circuit were exposed and deposited fast thereon at 140° C. by the use of a roll laminator. The composite was cooled and the underlying copper plated layer on the side opposite the polyester film was removed by etching with an etching agent of the following composition.

| Cupric chloride | 200 g/liter |
| --- | --- |
| 35% hydrochloric acid | 50 g/liter |

A total of 20 flexible printed wiring boards were trially manufactured by following the procedure described above. All the samples were found to be satisfactory.

EXAMPLE 3

A stainless steel board 200 mm × 300 mm in area had its surface abraded with cleanser and washed with neutral detergent. The board was washed with water and then immersed in a copper plating bath of the following composition until the plate consequently formed therein grew to a thickness of 8 μm.

| Copper sulfate | 75 g/liter |
| --- | --- |
| Sulfuric acid | 190 g/liter |
| Cupric chloride | 100 mg/liter |
| Glossing agent (Sulcup AC-90) | 5 ml/liter |

This plating was carried out at a current density of 3 A/dm$^2$ and a temperature of 25° C. Then the plated board was washed with water and had the surface thereof coarsened with a coarsening agent of the following composition.

| Ammonium persulfate | 200 g/liter |
| --- | --- |
| Sulfuric acid | 5 g/liter |

The coarsening treatment was performed at room temperature for 2 minutes, with the coarsening agent kept swirled. The plated board was throughly washed with water and dried. A dry film 80 μm in thickness (produced by Hitachi Chemical Co., Ltd. and marketed under trademark designation of Fotek SR-3000) was deposited thereon by lamination and a mask for defining a conductor circuit pattern was deposited fast thereon. The film was exposed to the ultraviolet light. Then, the film was developed in trichloroethane to form a plating resist pattern. The resultant composite was sbuejcted to eelctric plating with copper in the aforementioned copper sulfate plating bath under the aforementioned plating conditions, to form a conductor circuit 80 μm in thickness. Slits were formed on the peripheral part of the composite and a corner formed by such slits was nipped and pulled up to separate the conductor circuit and the underlying copper plated layer from the stainless steel board. Subsequently, an insulating resin of the following composition was applied by screen printing on the entire surface exposing the conductor circuit. Then the applied resin was dried. Consequently, there was formed an insulating resin film about 15 μm in thickness.

| | |
| --- | --- |
| Polyester resin (produced by Toyobo Co., Ltd. and marketed under trademark designation of Byron 200) | 40 parts by weight |
| Powdered calcium carbonate (average particle diameter 1 um) | 5 parts by weight |
| Silicon oxide (produced by Nippon Aerosil Co., Ltd. and marketed under trademark designation of Aerosil #300) | 1 parts by weight |
| Acrylic ester type copolymer (produced by Monsanto Industrial Chemicals Co., a unit of Monsanto Company and marketed under trademark designation of Modaflow) | 1 parts by weight |
| Isocyanate (produced by Takeda Chemical Industries, Ltd. and marketed under trademark desgination of D-120N) | 12 parts by weight |
| Butyl cellosolve acetate | 60 parts by weight |

Then, the copper plated layer about 8 μm was removed by etching with an aqueous 200 g/liter ammonium persulfate solution.

Two substrates each having a desired circuit pattern formed by the procedure described above were correctly registered and joined by the union of their insulating substratal materials to give rise to a printed coil unit having conductor circuit patterns on both sides thereof. The union was performed at 140° C. under pressure of 2 kg.f/cm² for one hour's standing. To establish connection between necessary parts of the two conductor circuits, spot welds were formed across the insulating substratal layers. Consequently, a printed coil unit was completed. A total of 100 printed coil units were trially manufactured. All the samples proved satisfactory.

COMPARATIVE EXPERIMENT 1

For the purpose of comparison, the procedure of Example 1 was repeated, except that the formation of a copper plate 6 in a thickness of 5 μm on the stainless steel board 1 and the coarsening of the surface of the copper layer formed by plating were both omitted.

A total of 20 printed wiring boards were trially manufactured by the procedure. During the course of electric plating for the formation of conductor circuit, local separation of the plating resist 2 from the stainless steel board 1 was observed. Thus, none of the samples proved satisfactory.

COMPARATIVE EXPERIMENT 2

The procedure of Example 1 was repeated, except that the coarsening of the surface of the copper layer formed by plating in a thickness of 5 μm on the stainless steel board 1 was omitted.

A total of 20 printed wiring boards were trially manufactured by the procedure. In 13 of the samples, separation of the plating resist 2 from the underlying copper plated layer 6 was observed while the plating for the formation of conductor circuit was in process. None of the samples proved satisfactory.

We claim:

1. A method for the manufacture of a printed wiring board, characterized by comprising the following steps in the order mentioned:
   (1) the step of applying a metallic film on a substrate,
   (2) the step of forming a plating resist on said metallic film except the portion intended for the formation of a conductor circuit,
   (3) the step of plating said metallic film surface covered with said plating resist thereby forming a conductor circuit,
   (4) the step of separating said metallic film, said conductor circuit, and the said plating resist jointly from said substrate,
   (5) the step of transferring them to an insulating substrate, and
   (6) the step of removing said metallic film so transferred by etching.

2. A method according to claim 1, which further comprises a step of coarsening the surface of said metallic film formed in the step (1).

3. A method according to claim 1, wherein the surface of said insulating substratal material for transfer has adhesive agent applied thereon in advance.

4. A method according to claim 1, wherein said transfer is effected by applying an insulating substratal material by printing subsequently to the step of separation.

5. A method according to claim 1, wherein said printed wiring board is in the form of a printed coil.

6. A method for the manufacture of a printed wiring board, characterized by comprising the following steps in the order mentioned:
   (1) the step of applying a metallic film on a substrate,
   (2) the step of forming a plating resist on said metallic film except the portion for the formation of a conductor circuit,
   (3) the step of plating said metallic film surface covered with said plating resist thereby forming a conductor circuit,
   (4) the step of applying an insulating substratal material to adhere firmly to the surface of said plating resist and that of said conductor circuit, separating said metallic film, said conductor circuit, and said plating resist in conjunction with said insulating substratal material from said substrate, and immediately effecting their transfer, and
   (5) the step of removing said metallic film so transferred by etching.

7. A method according to claim 6, which further comprises a step of coarsening the surface of said metallic film formed in the step (1).

8. A methd according to claim 6, wherein the surface of said insulating substratal material for transfer has adhesive agent applied thereon in advance.

9. A method according to claim 6, wherein said insulating substratal material is deposited by printing on the surface of said resist.

10. A method according to claim 6, wherein said printed wiring board is in the form of a printed coil.

11. A method for the manufacture of a printed coil, characterized by comprising the following steps in the order mentioned:
    (1) the step of applying a metallic film on a substrate,
    (2) the step of forming a plating resist on said metallic film except the portion intended for the formation of a conductor circuit,
    (3) the step of plating said metallic film surface covered with said plating resist thereby forming a conductor circuit,
    (4) the step of separating said metallic film, said conductor circuit, and said plating resist jointly from said substrate,
    (5) the step of transferring these separated components to an insulating substrate,
    (6) the step of removing by etching said metallic film so transferred, thereby producing in consequence of the foregoing steps a printed wiring board having a conductor circuit formed therein in a spiral shape, and
    (7) the step of alternately superposing circuit resist layers containing the spiral circuit and insulating substrate layers and, at the same time, establishing electric continuity between the adjacent spiral circuits.

12. A method according to claim 11, which further comprises a step of coarsening the surface of said metallic film formed in the step (1).

13. A method according to claim 11, wherein the surface of said insulating substratal material for transfer has adhesive agent applied thereon in advance.

14. A method according to claim 11, wherein said transfer is effected by applying an insulating substratal material by printing subsequently to the step of separation.

15. A method for the manufacture of a printed coil, characterized by comprising the following steps in the order mentioned: (1) the step of applying a metallic film on a substrate, (2) the step of forming a plating resist on said metallic film except the portion intended for the formation of a conductor circuit, (3) the step of plating said metallic film surface covered with said plating resist thereby forming a conductor circuit, (4) the step of applying an insulating substratal material to adhere firmly to the surface of said plating resist and that of said conductor circuit, separating said metallic film, said conductor circuit, and said plating resist in conjunction with said insulating material from said substrate, and immediately effecting their transfer, (5) the step of removing by etching said metallic film so transferred, thereby producing in consequence of the foregoing steps a printed wiring board having a conductor circuit formed therein in a spiral shape, and (6) the step of alternately superposing circuit resist layers containing the spiral circuit and insulating substrate layers and, at the same time, establishing electric continuity between the adjacent spiral circuits.

16. A method according to claim 15, which further comprises a step of coarsening the surface of said metallic film formed in the step (1).

17. A method according to claim 15, wherein the surface of said insulating substratal material for transfer has adhesive agent applied thereon in advance.

18. A method according to claim 15, wherein said insulating substratal material is deposited by printing on the surface of said resist.

* * * * *